(12) United States Patent
Li et al.

(10) Patent No.: US 10,026,755 B2
(45) Date of Patent: Jul. 17, 2018

(54) ARRAY SUBSTRATE AND DISPLAY DEVICE (71) Applicant: Boe Technology Group Co., Ltd., Beijing (CN)

(72) Inventors: Wenbo Li, Beijing (CN); Pan Li, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/907,040

(22) PCT Filed: Aug. 19, 2015

(86) PCT No.: PCT/CN2015/087497
§ 371 (c)(1),
(2) Date: Jan. 22, 2016

(87) PCT Pub. No.: WO2016/165253
PCT Pub. Date: Oct. 20, 2016

(65) Prior Publication Data
US 2017/0154896 A1    Jun. 1, 2017

(30) Foreign Application Priority Data
Apr. 17, 2015 (CN) ............. 2015 2 0235532 U (51) Int. Cl.
*H01L 29/00* (2006.01)
*H01L 27/12* (2006.01)
*H01L 23/60* (2006.01)

(52) U.S. Cl.
CPC ............ *H01L 27/124* (2013.01); *H01L 23/60* (2013.01)

(58) Field of Classification Search
USPC ............................................ 257/59, 444, 48
See application file for complete search history.

(56) References Cited

U.S. PATENT DOCUMENTS 6,340,998 B1    1/2002  Kim et al.
8,035,298 B2 *  10/2011 Jeong ................. H01L 27/3276
                                                     313/498
(Continued)

FOREIGN PATENT DOCUMENTS

CN       1529197       9/2004
CN     101201520       6/2008
(Continued)

OTHER PUBLICATIONS

International Search Report and Written Opinion from PCT/CN15/87497 dated Dec. 18, 2015.

*Primary Examiner* — Timor Karimy
(74) *Attorney, Agent, or Firm* — Calfee, Halter & Griswold LLP (57) ABSTRACT

An array substrate and a display device, which relates to the field of display technology. The array substrate comprises a base substrate, a plurality of first signal lines and a plurality of second signal lines crossly arranged above the base substrate; the first signal line comprises a first line terminal and a second line terminal, as well as a conducting layer opposite to the second signal line for connecting the first line terminal and the second line terminal, and an insulating layer is arranged between the conducting layer and the second signal line, a plurality of first anti-static structures are arranged at joints of the first line terminal, the second line terminal and the conducting layer respectively. The array substrate and the display device provided by the present invention can reduce interference between the plurality of crossed signal lines.

19 Claims, 5 Drawing Sheets

(56) References Cited

U.S. PATENT DOCUMENTS

| | | | | |
|---|---|---|---|---|
| 8,426,937 B2 * | 4/2013 | Otani | ............... | G01J 1/42 |
| | | | | 250/206 |
| 2015/0038033 A1 * | 2/2015 | Gaynor | ............... | H01B 1/22 |
| | | | | 442/52 |

FOREIGN PATENT DOCUMENTS

| | | |
|---|---|---|
| CN | 201845768 | 5/2011 |
| CN | 202049314 | 11/2011 |
| CN | 204481026 | 7/2015 |
| KR | 20100070729 | 6/2010 |

* cited by examiner

Fig. 9

ARRAY SUBSTRATE AND DISPLAY DEVICE

RELATED APPLICATIONS

The present application is the U.S. national phase entry of PCT/CN2015/087497, with an international filing date of Aug. 19, 2015, which claims the benefit of Chinese Patent Application No. 201520235532.3, filed on Apr. 17, 2015, the entire disclosures of which are incorporated herein by reference.

FIELD OF THE INVENTION

The present invention relates to the field of display technology, particularly to an array substrate and a display device.

BACKGROUND OF THE INVENTION

With the rapid development of electronic devices, display panels have been applied in electronic devices increasingly. The existing display panel generally comprises an array substrate and a color film substrate, and the array substrate is one of the important components of the display panel.

The array substrate is usually provided with a plurality of signal lines, such as gate lines, data lines, gate detection lines, data detection lines and common electrode lines and so on. Since there are a large amount of signal lines in the array substrate, the phenomenon of cross of a plurality of signal lines often occur, and when an electrostatic release signal comes up in at least one signal line of the plurality of crossed signal lines, electrostatic charges may be gathered in the cross areas of the plurality of signal lines, such that the cross areas of the plurality of signal lines may produce capacitive coupling, thereby generating interference phenomenon in the cross areas of the plurality of signal lines, thus performance of the array substrate would be reduced.

SUMMARY OF THE INVENTION

An object of the present invention is providing an array substrate and a display device for mitigating interference phenomenon generated in the cross areas of a plurality of signal lines, so as to improve performance of the array substrate.

In order to achieve the above object, embodiments of the present invention provide the following technical solutions.

On the one hand, an embodiment of the present invention provides an array substrate, the array substrate comprising a base substrate, a plurality of first signal lines and a plurality of second signal lines crossly arranged above the base substrate; the first signal line comprises a first line terminal and a second line terminal, as well as a conducting layer opposite to the second signal line for connecting the first line terminal and the second line terminal, and an insulating layer is arranged between the conducting layer and the second signal line, a plurality of first anti-static structures are arranged at joints of the first line terminal, the second line terminal with the conducting layer respectively.

In an embodiment, via holes for conducting with the conducting layer can be arranged on the first line terminal and the second line terminal of each of the first signal lines, respectively.

In another embodiment, a plurality of second anti-static structures are arranged at one side or two sides of an area of the second signal line corresponding to the conducting layer.

In an embodiment, the first or the second anti-static structures can be discharge tips.

In another embodiment, the plurality of second signal lines can be arranged in different layers or arranged in a same layer.

In another embodiment, the first line terminal and the second line terminal of the first signal line can be arranged in a same layer, the second signal line and the first line terminal and the second line terminal of the first signal line can be arranged in different layers.

In a further embodiment, the first line terminal and the second line terminal of the first signal line can be arranged in a same layer, and arranged in a same layer with at least one of the second signal lines.

In a further embodiment, the first line terminal and the second line terminal of the first signal line can be arranged in different layers, one of the first line terminal and the second line terminal of the first signal line and at least one of the second signal lines can be arranged in a same layer.

In an embodiment, the first signal lines can be gate detection lines, the second signal lines can be data detection lines.

In another embodiment, the first signal lines can be switch lines or data detection lines, the second signal lines can be common electrode lines.

In the preceding embodiments, the conducting layer can be an indium tin oxide layer.

On the other hand, the present invention provides a display device comprising the array substrate as stated in any of the above technical solutions.

In the array substrate and the display device provided by the embodiments of the present invention, the first signal lines and the second signal lines are crossly arranged, the first signal line comprises a first line terminal, a second line terminal and a conducting layer for conducting the first line terminal and the second line terminal, an insulating layer is arranged between the conducting layer and the second signal line, such that the vertical distance between the first signal line and the second signal line is increased in the cross area of the first signal line and the second signal line, the electrostatic charges gathered in the cross area of the first signal line and the second signal are reduced; moreover, since a plurality of first anti-static structures are arranged at joints of the first line terminal, the second line terminal with the conducting layer of the first signal line respectively, the first anti-static structure can guide and release the electrostatic charges gathered in the cross area of the first signal line and the second signal line when an electrostatic discharge signal comes up in the first signal line and/or the second signal line, thereby reducing capacitive coupling of the crossed first signal line and second signal line, and mitigating the interference phenomenon in the cross area of the first signal line and the second signal line, so as to improve performance of the array substrate.

BRIEF DESCRIPTION OF THE DRAWINGS

The drawings explained here are used for providing further understanding to the present invention, which constitute part of the present invention, the schematic embodiments of the present invention and the illustrations thereof are used for explaining the present invention, which do not constitute inappropriate definitions to the present invention. In the drawings.

| Reference signs: | |
|---|---|
| 10-base substrate, | 11-second signal line, |
| 12-first line terminal, | 13-second line terminal, |
| 14-conducting layer, | 15-insulating layer, |
| 16-first anti-static structure, | 17-via hole, |
| 18-first signal line | 19-second anti-static structure. |

DETAILED DESCRIPTION OF THE INVENTION

In order to further explain the array substrate and the display device provided by the embodiments of the present invention, the following detailed description is provided with reference to the drawings.

Figure 1:
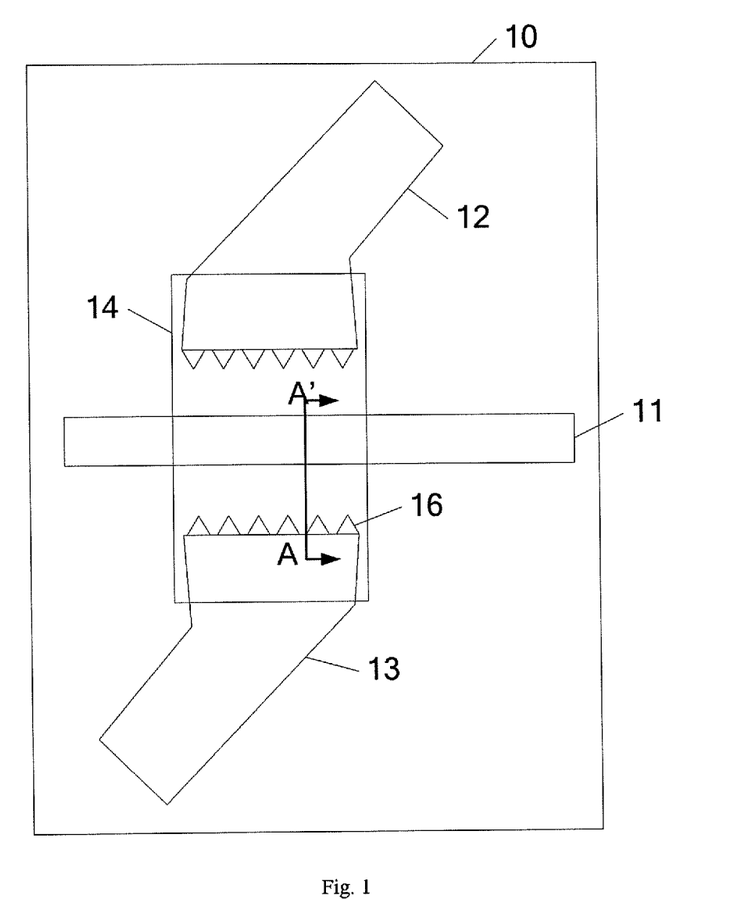
FIG. 1 is a schematic view of a planar structure of an array substrate according to an embodiment of the present invention.
Figure 2:
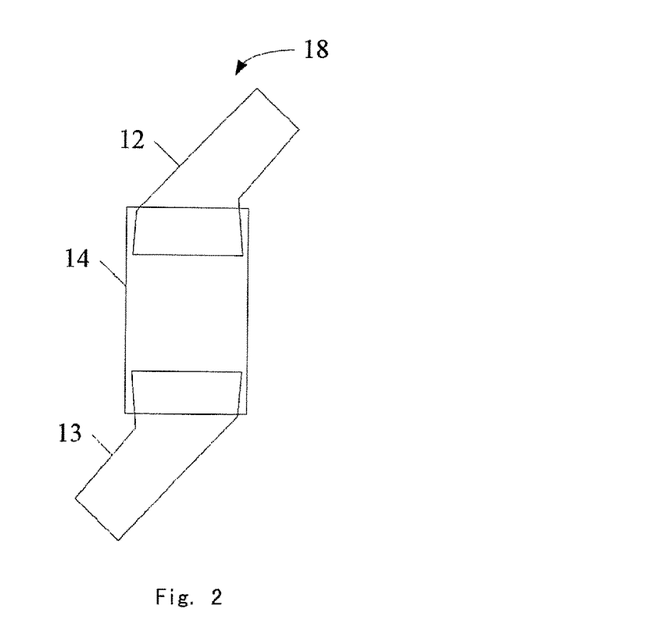
FIG. 2 is a structural schematic view of a first signal line in the array substrate as shown in FIG. 1.
Figure 3:
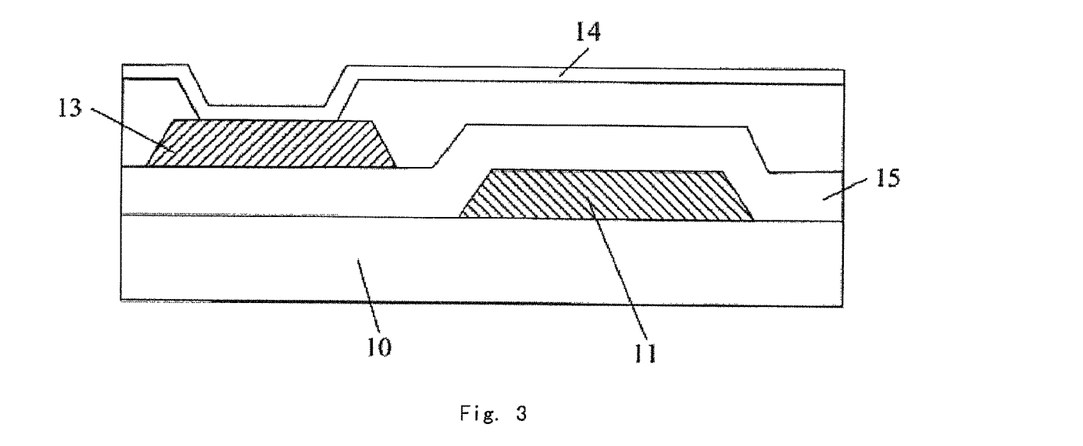
FIG. 3 is a sectional view of the array substrate as shown in FIG. 1 obtained along A-A' line in FIG. 1.

Referring to FIG. 1, FIG. 2 and FIG. 3, an array substrate provided by an embodiment of the present invention may comprise: a base substrate 10, first signal lines 18 and second signal lines 11 crossly arranged above the base substrate 10, wherein the first signal lines 18 or the second signal lines 11 can be gate lines, data lines, data detection lines, common electrode lines, test signal lines or short circuit rings and so on; as shown in FIG. 2, the first signal line 18 can comprise a first line terminal 12, a second line terminal 13 and a conducting layer 14 opposite to the second signal line 11 for connecting the first line terminal 12 and the second line terminal 13. Referring to FIG. 1 and FIG. 3, an insulating layer 15 can be arranged between the conducting layer 14 and the second signal line 11, thereby enabling the conducting layer 14 to bypass the second signal line 11, and avoid contact with the second signal line 11. Moreover, a plurality of first anti-static structures 16 can be arranged at joints of the first line terminal 12, the second line terminal 13 of the first signal line 18 with the conducting layer 14.

In the array substrate provided by the embodiment of the present invention, the first signal line 18 and the second signal line 11 are crossly arranged, the first signal line 18 comprises a first line terminal 12, a second line terminal 13 and a conducting layer 14 for conducting the first line terminal 12 and the second line terminal 13, an insulating layer 15 is arranged between the conducting layer 14 and the second signal line 11, such that the vertical distance between the first signal line 18 and the second signal line 11 is increased in the cross area of the first signal line 18 and the second signal line 11, the electrostatic charges gathered due to too short distance between the first signal line 18 and the second signal 11 can be reduced. A plurality of first anti-static structures 16 are arranged at joints of the first line terminal 12, the second line terminal 13 of the first signal line 18 with the conducting layer 14 respectively, the plurality of first anti-static structures 16 can guide and release the electrostatic charges gathered in the cross area of the first signal line 18 and the second signal line 11 when an electrostatic discharge signal comes up in the first signal line 18 and/or the second signal line 11, thereby reducing capacitive coupling of the crossed first signal line 18 and second signal line 11, and mitigating the interference phenomenon in the cross area of the first signal line 18 and the second signal line 11, so as to improve performance of the array substrate. Meanwhile, releasing electrostatic charges through the first anti-static structures 16 can also prevent the electrostatic charges from burning the conducting layer 14. The first anti-static structures 16 can be formed simultaneously with the first line terminal or the second line terminal as part of the first line terminal or the second line terminal of the first signal line 18.

On the basis of the above embodiment, there may be embodiments of the array substrate in various other structure forms based on the positional relationship between the first line terminal 12, the second line terminal 13 of the first signal line 18 and the second signal line 11.

In another embodiment, the first line terminal 12 and the second line terminal 13 of the first signal line 18 can be arranged in a same layer, the second signal line 11 and the first line terminal 12, the second line terminal 13 of the first signal line 18 can be arranged in different layers, wherein the first signal line 18 can be a gate detection line, the second signal line 11 can be a data detection line.

Figure 4:
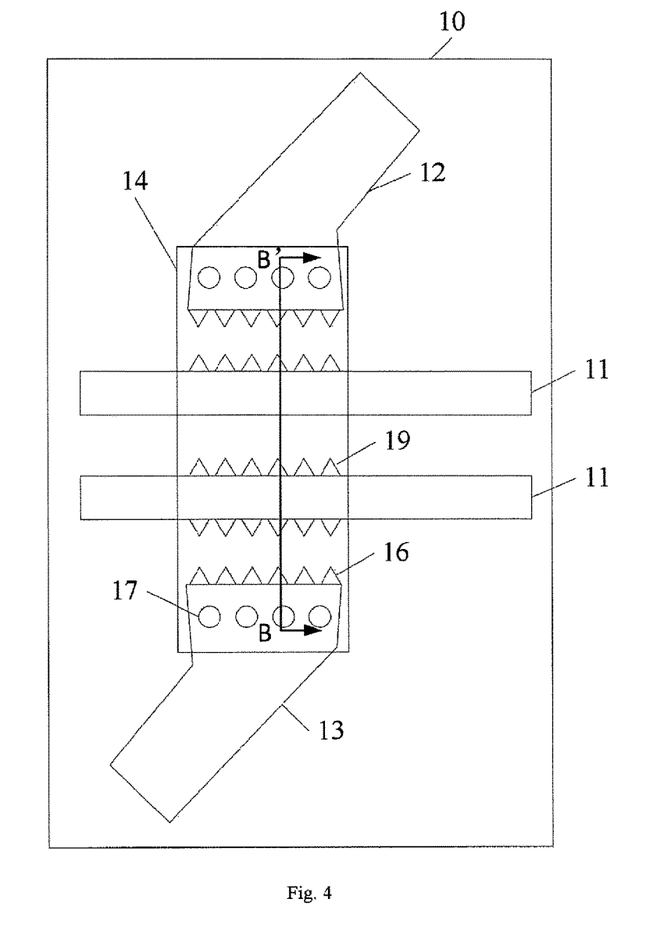
FIG. 4 is a schematic view of a planar structure of an array substrate according to another embodiment of the present invention.
Figure 5:
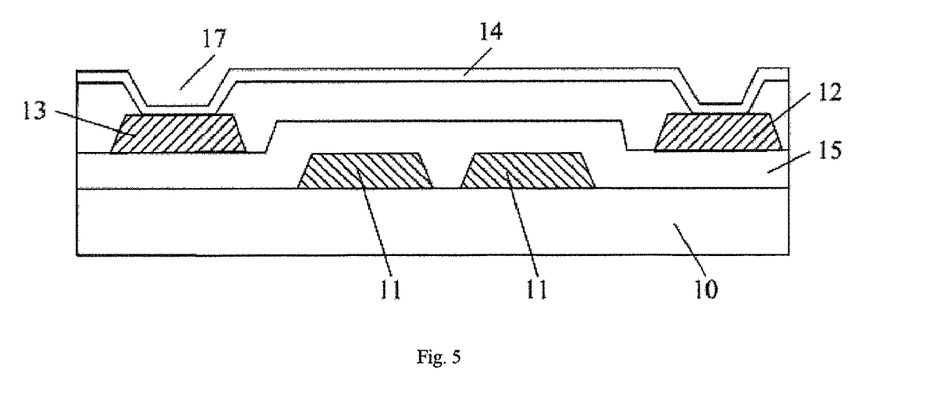
FIG. 5 is a sectional view of the array substrate as shown in FIG. 4 obtained along B-B' line in FIG. 4.
Figure 6:
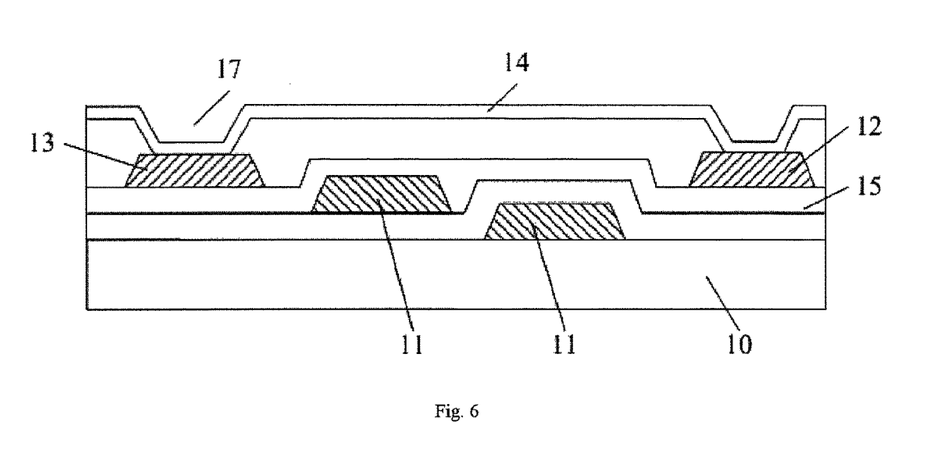
FIG. 6 is a sectional view of the array substrate according to another embodiment of the present invention obtained along B-B' line in FIG. 4.

Referring to FIG. 4, FIG. 5 and FIG. 6, the number of the second signal lines 11 crossed with one of the first signal lines 18 may be one or more. In the case that the first line terminal 12 and the second line terminal 13 of the first signal line 18 are arranged in a same layer, the second signal line 11 and the first line terminal 12, the second line terminal 13 are arranged in different layers, a plurality of second signal lines 11 can be arranged in a same layer, and can also be arranged in different layers. For example, as shown in FIG. 5, the first line terminal 12 and the second line terminal 13 of the first signal line 18 are arranged in a same layer, the second signal line 11 and the first line terminal 12, the second line terminal 13 are arranged in different layers, there are two second signal lines 11, and the two second signal lines 11 are arranged in a same layer, e.g., the second signal lines 11 can be an odd data detection line and even data detection line. For another example, as shown in FIG. 6, the first line terminal 12 and the second line terminal 13 of the first signal line 18 are arranged in a same layer, the second signal line 11 and the first line terminal 12, the second line terminal 13 are arranged in different layers, there are two second signal lines 11, and the two second signal lines 11 are arranged in different layers.

For the above structures, the conducting layer for conducting the first line terminal 12 and the second line terminal 13 can be an indium tin oxide layer. Via holes 17 for conducting with the conducting layer 14 can be arranged on the first line terminal 12 and the second line terminal 13 respectively, in the process of manufacturing the array substrate, for example, in the evaporation process for the conducting layer 14, electrostatic charges may also be gathered easily in the via hole 17 or some other areas with very small radius of curvature, the first anti-static structures 16 arranged on the first line terminal 12 and the second line terminal 13 can release and guide the electrostatic charges in the vicinity of the via holes. Moreover, as shown in FIG. 4, in order to further release the electrostatic charges on the second signal line 11, a plurality of second anti-static structures 19 are arranged at one side or two sides of the area of the second signal lines 11 corresponding to the conducting layer 14, specifically the second anti-static structures 19 can be discharge tips. The second anti-static structures 19 at one side or two sides of the second signal line 11 can be formed simultaneously with the second signal line 11 as part of the second signal line 11.

In another embodiment, the first line terminal 12 and the second line terminal 13 of the first signal line 18 can be arranged in a same layer, and arranged in the same layer with at least one second signal line 11. The first signal line 18 can be a test signal line or a data detection line, the second signal line 11 can be a common electrode line.

Figure 7:
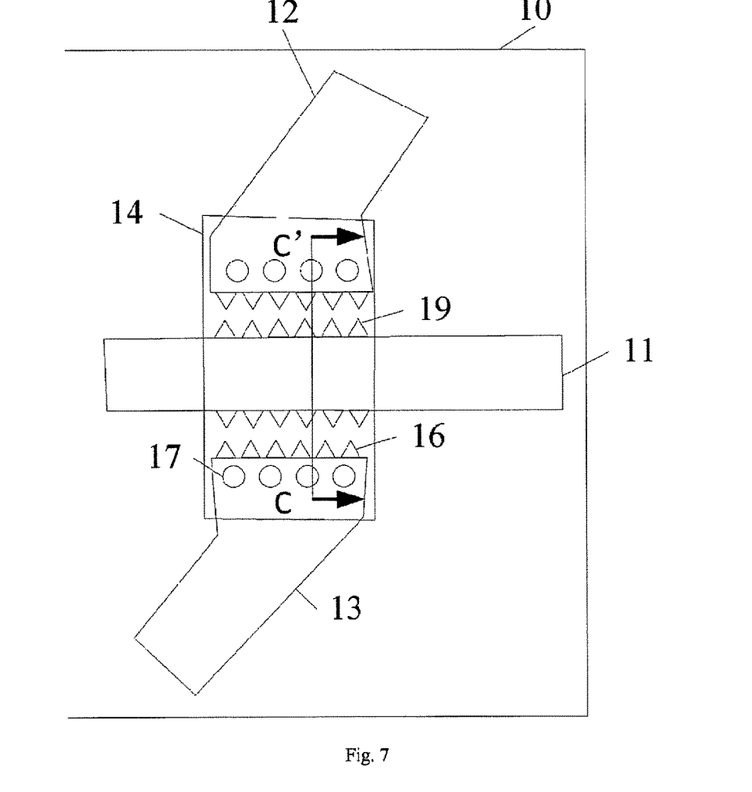
FIG. 7 is a schematic view of a planar structure of an array substrate according to a further embodiment of the present invention.
Figure 8:
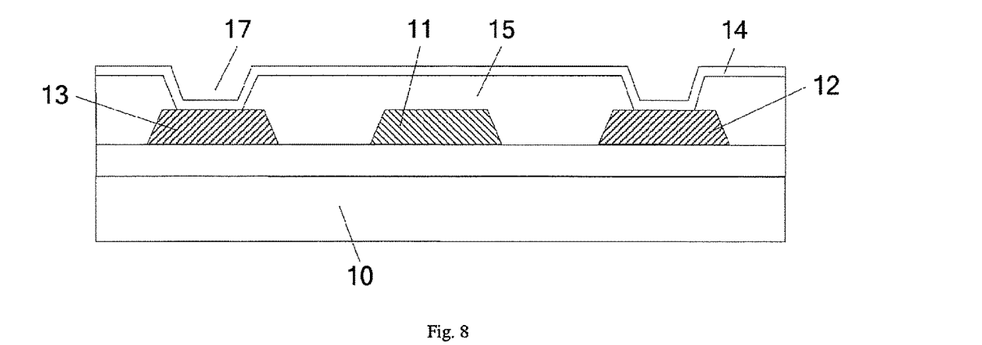
FIG. 8 is a sectional view of the array substrate as shown in FIG. 7 obtained along C-C' line in FIG. 7.

Similar to the preceding embodiment, there may be one or more second signal lines 11 crossed with one of the first signal lines 18. Referring to FIG. 7 and FIG. 8, the first line terminal 12 and the second line terminal 13 of the first signal line 18 can be arranged in a same layer, and arranged in the same layer with at least one second signal line 11. There may be one second signal line 11 crossed with the first signal line 18, the first line terminal 12 and the second line terminal 13 of the first signal line 18 can be arranged in a same layer, and arranged in the same layer with the second signal line 11, the conducting layer 14 for the first signal line 18 bypasses the second signal line 11 and conducts the first line terminal 12 and the second line terminal 13. The conducting layer 14 can be an indium tin oxide layer. It needs to be noted that in the case that there are a plurality of second signal lines 11 crossed with the first signal line 18, the plurality of second signal lines 11 can be arranged in a same layer, that is to say, the first line terminal 12 and the second line terminal 13 of the first signal line 18 can be arranged in a same layer, and arranged in the same layer with a plurality of second signal lines 11; alternatively, the plurality of second signal lines 11 can also be arranged in different layers, that is to say, the first line terminal 12 and the second line terminal 13 of the first signal line 18 can be arranged in a same layer, and arranged in the same layer with at least one second signal line 11 in the plurality of second signal lines 11, other second signal lines 11 and the first line terminal 12, the second line terminal 13 are arranged in different layers. The embodiments of the structure of the array substrate having a plurality of second signal lines 11 and the positional relationship between the plurality of second signal lines 11 can make reference to FIG. 4, FIG. 5 and FIG. 6. It is noted that the specific explanations of structures such as the via holes 17 on the first line terminal 12, the second line terminal 13, and the second anti-static structures 19 on the second signal line 11 may make reference to the preceding embodiments, which will not be repeated here.

In a further embodiment, the first line terminal 12 and the second line terminal 13 of the first signal line 18 can be arranged in different layers, one of the first line terminal 12 and the second line terminal 13 of the first signal line 18 can be arranged in the same layer with at least one of the second signal lines 11.

Figure 9:
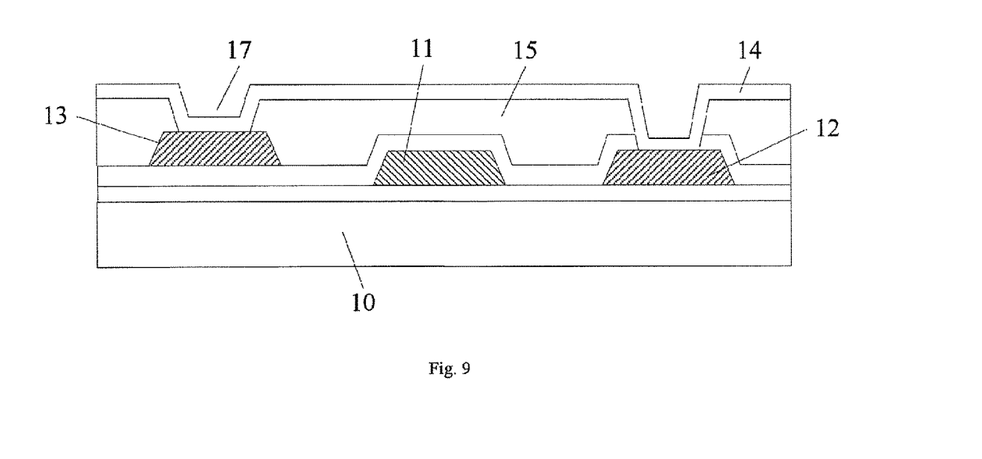
FIG. 9 is a sectional view of an array substrate according to a further embodiment of the present invention.

Referring to FIG. 9, in the case that the first line terminal 12 of the first signal line 18 and one second signal line 11 are arranged in a same layer, and the second line terminal 13 and the second signal line 11 are arranged in different layers, the conducting layer 14 bypasses the second signal line 11 and conduct the first line terminal 12 and the second line terminal 13 arranged in different layers. It needs to be noted that, if there are a plurality of second signal lines 11 crossed with the same first signal line 18, the plurality of second signal lines 11 can be arranged in a same layer, for example, the first line terminal 12 can be arranged in the same layer with a plurality of second signal lines 11, the second line terminal 13 can be arranged in different layers with the plurality of second signal lines 11; alternatively, the plurality of second signal lines 11 can also be arranged in different layers, for example, the first line terminal 12 and at least one second signal line 11 in the plurality of second signal lines 11 are arranged in the same layer, other second signal lines 11 and the first line terminal 12 are arranged in different layers. The embodiments of the structure of the array substrate having a plurality of second signal lines 11 and the positional relationship between the plurality of second signal lines 11 can make reference to FIG. 4, FIG. 5 and FIG. 6. It is noted that the specific explanations of structures such as the via holes 17 on the first line terminal 12, the second line terminal 13, and the second anti-static structures 19 on the second signal line 11 may make reference to the preceding embodiments, which will not be repeated here.

The embodiment of the present invention further provides a display device, the display device may comprise the array substrate described in any of the above embodiments, and the array substrate of the display device has the same advantages as the array substrate in the above embodiments, which will not be repeated here. Since the interference phenomenon generated in the cross area of the signal lines in the array substrate is reduced, the performance of the array substrate is improved, hence, the display performance of the display device is improved. The display device may be any product or component with displaying function such as a liquid crystal display panel, electronic paper, a mobile phone, a panel computer, a television, a display, a laptop, a digital photo frame, a navigator etc.

In the description of the above embodiments, the specific features, structures, materials or characteristics may be combined in any one or more embodiments or examples.

The disclosure herein includes specific embodiments of the present invention, however, the protection scope of the present invention is not limited to these, and any modification or replacement that can be easily conceived by a person having ordinary skill in the present technical field should be covered within the protection scope of the present invention. Therefore, the protection scope of the present invention should be subject to the protection scope of the claims.

The invention claimed is:

1. An array substrate comprising:
    a base substrate;
    a plurality of first signal lines and a plurality of second signal lines
    crossly arranged above the base substrate,
    wherein the first signal line comprises a first line terminal and a second line terminal, as well as a conducting layer opposite to the second signal line for connecting the first line terminal and the second line terminal, and
    wherein an insulating layer is arranged between the conducting layer and the second signal line, a plurality of first anti-static structures are arranged at joints of the first line terminal and the second line terminal with the conducting layer respectively,
    the plurality of first anti-static structures are close to a cross area of the first signal line and the second signal line for releasing electrostatic charges gathered in the cross area,
    wherein the conducting layer is an indium tin oxide layer.
2. The array substrate according to claim 1, wherein via holes for conducting with the conducting layer are arranged on the first line terminal and the second line terminal of each of the first signal lines respectively.

3. The array substrate according to claim 2, wherein the first line terminal and the second line terminal of the first signal line are arranged in a same layer, the second signal line and the first line terminal and the second line terminal of the first signal line are arranged in different layers.

4. The array substrate according to claim 2, wherein the first line terminal and the second line terminal of the first signal line are arranged in a same layer, and are arranged in a same layer with at least one of the second signal lines.

5. The array substrate according to claim 2, wherein the first line terminal and the second line terminal of the first signal line are arranged in different layers, one of the first line terminal and the second line terminal of the first signal line and at least one of the second signal lines are arranged in a same layer.

6. The array substrate according to claim 1, wherein a plurality of second anti-static structures are arranged at one side or two sides of an area of the second signal line corresponding to the conducting layer.

7. The array substrate according to claim 6, wherein the first anti-static structures or the second anti-static structures are discharge tips.

8. The array substrate according to claim 7, wherein the first line terminal and the second line terminal of the first signal line are arranged in a same layer, and are arranged in a same layer with at least one of the second signal lines.

9. The array substrate according to claim 6, wherein the first line terminal and the second line terminal of the first signal line are arranged in a same layer, the second signal line and the first line terminal and the second line terminal of the first signal line are arranged in different layers.

10. The array substrate according to claim 6, wherein the first line terminal and the second line terminal of the first signal line are arranged in a same layer, and are arranged in a same layer with at least one of the second signal lines.

11. The array substrate according to claim 6, wherein the first line terminal and the second line terminal of the first signal line are arranged in different layers, one of the first line terminal and the second line terminal of the first signal line and at least one of the second signal lines are arranged in a same layer.

12. The array substrate according to claim 1, wherein the first anti-static structures or the second anti-static structures are discharge tips.

13. The array substrate according to claim 1, wherein the plurality of second signal lines are arranged in different layers or arranged in a same layer.

14. The array substrate according to claim 1, wherein the first line terminal and the second line terminal of the first signal line are arranged in a same layer, the second signal line and the first line terminal and the second line terminal of the first signal line are arranged in different layers.

15. The array substrate according to claim 14, wherein the first signal lines are gate detection lines, the second signal lines are data detection lines.

16. The array substrate according to claim 1, wherein the first line terminal and the second line terminal of the first signal line are arranged in a same layer, and are arranged in a same layer with at least one of the second signal lines.

17. The array substrate according to claim 16, wherein the first signal lines are test signal lines or data detection lines, the second signal lines are common electrode lines.

18. The array substrate according to claim 1, wherein the first line terminal and the second line terminal of the first signal line are arranged in different layers, one of the first line terminal and the second line terminal of the first signal line and at least one of the second signal lines are arranged in a same layer.

19. A display device comprising an array substrate, the array substrate comprising:
a base substrate;
a plurality of first signal lines and a plurality of second signal lines crossly arranged above the base substrate,
wherein the first signal line comprises a first line terminal and a second line terminal, as well as a conducting layer opposite to the second signal line for connecting the first line terminal and the second line terminal, and
wherein an insulating layer is arranged between the conducting layer and the second signal line, a plurality of first anti-static structures are arranged at joints of the first line terminal, the second line terminal with the conducting layer respectively,
the plurality of first anti-static structures are close to a cross area of the first signal line and the second signal line for releasing electrostatic charges gathered in the cross area,
wherein the conducting layer is an indium tin oxide layer.

* * * * *